United States Patent [19]

Ong

[11] Patent Number: 5,452,635
[45] Date of Patent: Sep. 26, 1995

[54] APPARATUS FOR INTEGRATED CIRCUIT LEAD-FRAME PUNCHING

[75] Inventor: EE-Chang Ong, Cupertino, Calif.

[73] Assignee: Integrated Packaging Assembly Corporation, San Jose, Calif.

[21] Appl. No.: 120,280

[22] Filed: Sep. 13, 1993

[51] Int. Cl.$^6$ ................................................. B21D 28/10
[52] U.S. Cl. .............................. 83/133; 83/618; 83/687; 83/691; 83/697
[58] Field of Search ..................... 83/133, 136, 139, 83/613, 618, 686, 691, 697, 942, 687; 29/827

[56] References Cited

U.S. PATENT DOCUMENTS

| | | | |
|---|---|---|---|
| 3,535,964 | 10/1970 | Ahlman | 83/697 |
| 3,785,236 | 1/1974 | Peterson | 83/686 |
| 4,399,610 | 8/1983 | Moyer | 29/827 |
| 4,510,786 | 4/1985 | Strangward | 83/136 |
| 4,742,746 | 5/1988 | Olsson | 83/133 |
| 5,163,350 | 11/1992 | Groswith, III et al. | 83/618 |

*Primary Examiner*—Rinaldi I. Rada
*Assistant Examiner*—Allan M. Schrock
*Attorney, Agent, or Firm*—Donald R. Boys

[57] ABSTRACT

A punch for removing material from lead frames has a substantially rectangular body with an array of grooves along one side and a step removed on one end from the side opposite the grooves to provide an array of punch teeth extending from the body of the punch. The grooves provide a means of reworking the punch to provide a new array of teeth, by machining away all or part of the teeth and then extending the step in the direction of the groove to provide substantially the original length for the individual teeth. By providing a punch with groove length several times the tooth length, the punch can be reworked several times before being discarded.

4 Claims, 7 Drawing Sheets

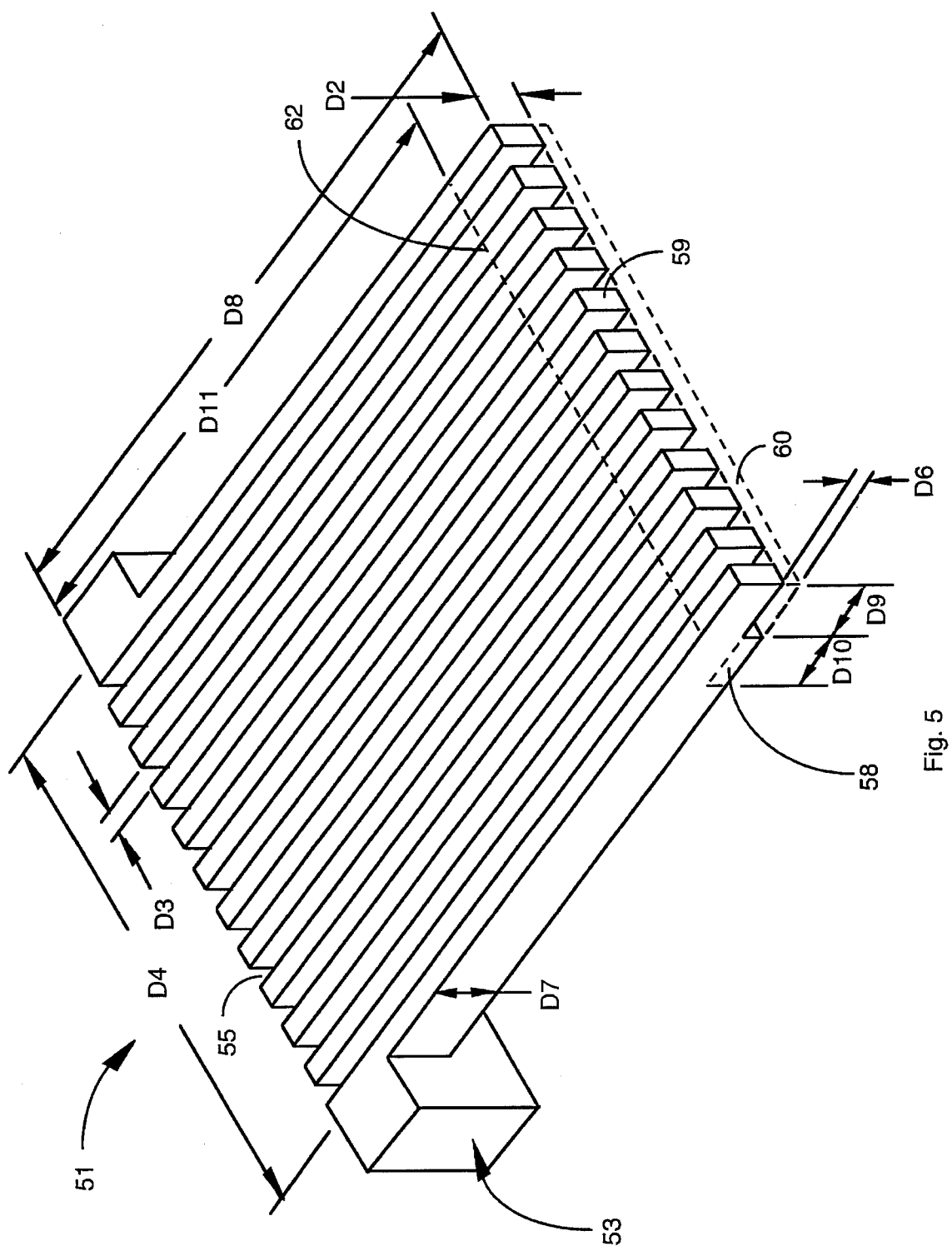

APPARATUS FOR INTEGRATED CIRCUIT LEAD-FRAME PUNCHING

FIELD OF THE INVENTION

The present invention is in the area of integrated circuit (IC) manufacturing, and pertains in particular to apparatus and methods for dambar removal and/or flash removal relative to lead frames in processes for encapsulating ICs with leads for mounting to electronic circuitry.

BACKGROUND OF THE INVENTION

In general, the plastic packaging of ICs is as follows: Typically, ICs in die form are attached to mounting areas called islands on strips called lead frames. The lead frames are made of a thin, flat, electrically conductive material and typically have several individual islands, each for supporting an individual IC. In most cases, densely packaged ICs are manufactured to maximize connectivity by utilizing all four sides of the chip.

Around the perimeter of each island a lead frame has a pattern of individual conductive leads extending toward, but not contacting the island. The islands and individual leads are formed by selective removal of material in the lead frame, such as by stamping. The number of the leads at a frame depends directly on the configuration of the particular IC die to be mounted. A typical IC may have over one hundred external connections and each frame will have a corresponding number of individual leads. The width of each lead and the separation between adjacent leads is dependant on the package size of the finished IC. The thickness of each lead is the thickness of the lead frame and is predicated on the current carrying capacity required.

A plastic package with external leads for connecting to, for example, a printed circuit board, is typically formed by an encapsulation process. Mating molds are placed on each side of the lead frame and liquid-phase polymer is injected to encapsulate the IC die. The lead frame is designed to dam the flow of liquid-phase polymer as it moves to the outer edges of each individual mold, stopping at where each mold contacts surfaces of the lead frame. To stop the flow of liquid-phase polymer between leads the lead frame has a pattern of dam bars between individual leads, so a contiguous band of material is formed around the periphery of the island. This contiguous band prevents the polymer from flooding the leadframe.

After the polymer solidifies and the molds are removed, a following operation in the manufacturing process removes the excess plastic in the region around the mold outline and the dam bars. This is termed de-junking in the art. A de-damming process then removes the dam bar between each lead, providing electronic integrity for each lead. De-damming is a process of removing all or part of each dam bar by use of a punch with a pattern of teeth conforming to the pattern of the dam bars in the lead frame. Typically, the de-damming and de-junking can be done in a single step. In following processing each lead exposed from the edge of the plastic package is further treated such as by plating, and the individual packages are trimmed from the lead frame strip. Finally, the leads are formed, such as for Surface Mount Technology (SMT) applications.

In state-of-the-art manufacturing, automated machines perform the de-junking and de-damming operations. Automatic machines are marketed by Iwtani International Corporation of Tokyo, Japan and Fujitsu of Japan, among others. In the de-damming operation, typically a hydraulically driven, hardened metal punch is used to trim the dam bar from between the conductive leads. The punch is critically machined to provide a clean cut for each dam bar to insure physical dimensions and electrical integrity. In one case, the de-damming punch is designed to cut the dam bar between every second pair of leads of an IC package. This is done to minimize the manufacturing cost of the punches used for de-damming. In most instances, an automated machine will have two opposing dam bar punches working in unison on opposite sides the package. In this case, the complete de-damming operation may take up to four stages to trim all dam bars from each package.

The dam bar punches are produced uniquely for specific IC packages since many ICs have different lead counts, lead pitches and package sizes. The punches must be manufactured to maintain functional integrity over many cycles. As pitch sizes get smaller so do the de-damming punch's individual teeth that clear the dam bar between individual leads. When a tooth breaks, the entire punch must be replaced. The broken punch is typically discarded because it is more economical to buy a replacement than to try to repair/re-machine a new set of teeth on the same punch.

As described above, de-damming punches are typically made to punch every second dam bar. This is done to control manufacturing costs for the punches, as it allows wider spacing between individual teeth, and punches with wider spacing are less expensive to produce. There is a disadvantage, however. As IC lead aspect ratios decrease because of the higher pin counts and smaller packages, shearing forces increase and tend to twist the alternately punched leads. Then, when the lead is formed for a SMT application, the lead pad positioning may be offset, decreasing production yields.

What is needed is a de-damming punch compatible with existing state-of-the-art automated machinery that can be cost effectively reworked rather than discarded. Such a punch should preferably punch every dam bar on a side in one action, assuring coplanarity in pad positioning. This would save money by eliminating the need to provide a new punch every time a punch fails in use.

SUMMARY OF THE INVENTION

A punch for removing portions of material from a lead frame in a process for encapsulating integrated circuit (IC) chips with electrical leads is provided in an embodiment of the invention, comprising a mounting portion configured to attach the punch to a translating drive in a processing machine, and a shank portion with a substantially rectangular shape of length L1, Width W1, and thickness T1, extending from the mounting portion. The shank portion has a plurality of grooves on a first side beginning at the end opposite the mounting portion, spaced apart across width W1, extending in the direction of L1 for a length L2, and having a common depth T2 < T1. The grooves provide a spaced-apart array of ribs on the one side. A step formed across the end of the shank portion at the opposite end from the mounting portion, the step extending across width W1 on a second side opposite the first side to a depth T3 > (T1-T2) for a length L3 << L2, causes the ribs to extend from the end of the shank portion as an array of separate punch teeth.

In a preferred embodiment the punch is made of a tungsten carbide or equivalent material such as a through-hardened steel, and the grooves are several times longer than the extended teeth. The grooved construction allows a worn or damaged punch to be reworked by machining off a length of the separate punch teeth past the area of wear or damage, and extending the step by an equal amount to provide punch teeth of the original length.

With conventional punches without extended grooves, reworking a punch is equivalent to machining a new punch, requiring forming new teeth. With smaller and smaller spacing as a result of further miniaturization of ICs and packages, machining between the teeth is a more and more expensive process. As a result, a worn or broken conventional punch is best discarded in favor of a new punch. With the grooved punch according to embodiments of the present invention, reworking is a relatively simple and inexpensive process accomplished on a surface grinder, requiring only grinding off all or a portion of the length of the worn or damaged teeth, and extending the step on the ungrooved side to expose more tooth length.

In different aspects of the invention, a punch is provided, a punch station using the punch is provided, and an automated machine is provided having a station using a punch according to an embodiment of the invention. The novel and unique means of making and using a punch according to embodiments of the invention provides for considerable savings in operations for removal of dambars and other regions of material.

BRIEF DESCRIPTION OF THE DRAWINGS

FIG. 5 is an isometric view of a punch in an embodiment of the present invention.

DESCRIPTION OF THE PREFERRED EMBODIMENTS

Figure 1:
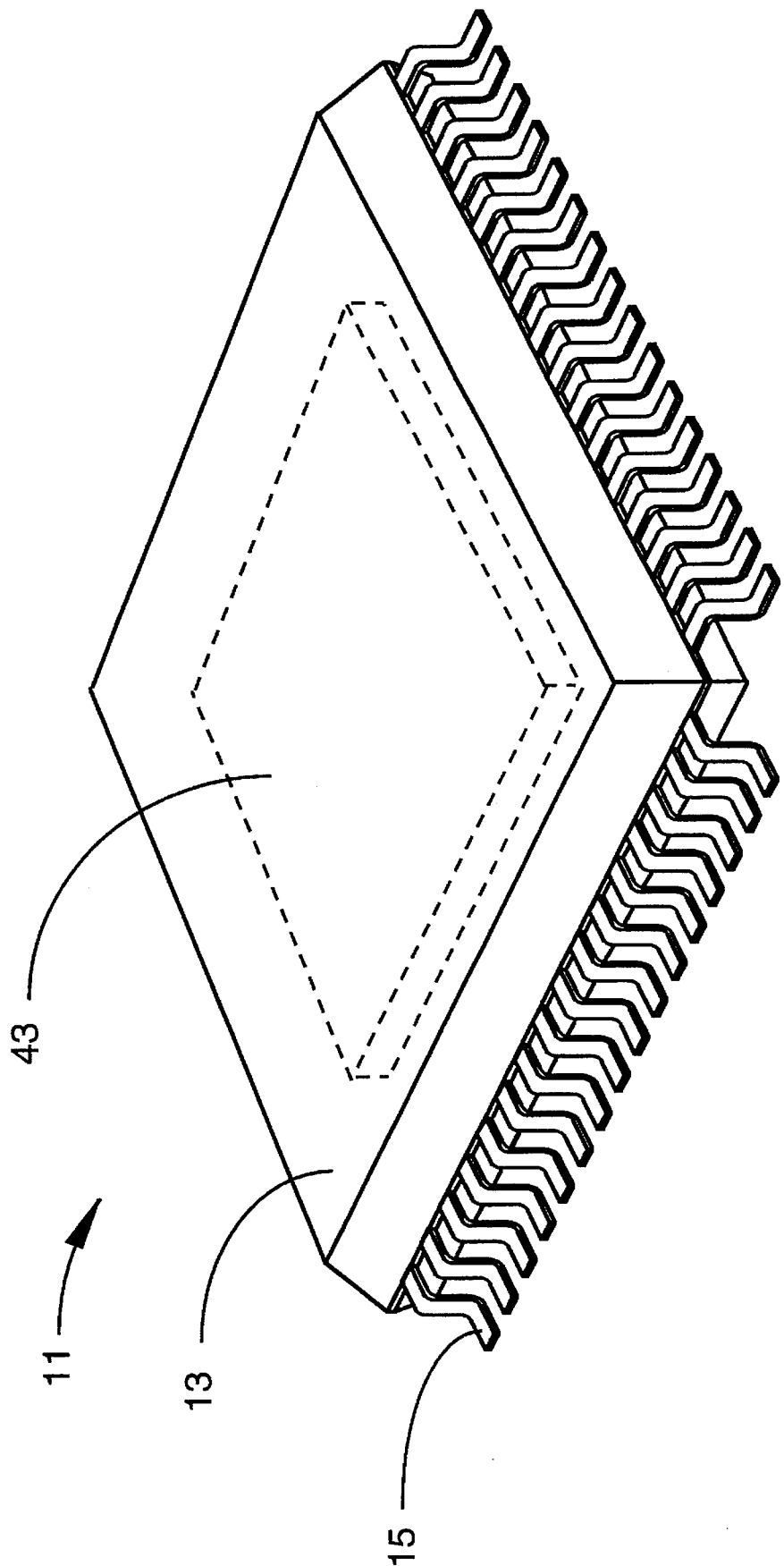
FIG. 1 is an isometric view of a conventional plastic molded QFP IC.

FIG. 1 is an isometric view of a conventional QFP IC package 11. Typically, body 13 of IC package 11 is formed of plastic material by a method of transfer molding. Die 43 is inside, and completely encapsulated by the plastic molded body. The die contains the circuitry that defines the electrical functions of a particular IC. The circuitry of the IC is connected to the outside environment through individual conductive leads 15. The leads, as show by this example, are formed into J-bends for SMT application in another process. The leads are typically constructed of a highly conductive material that is receptive to bending and forming while maintaining structural integrity. The package protects the sensitive and fragile circuitry on the IC die and fixes the arrangement of individual leads.

Figure 2:
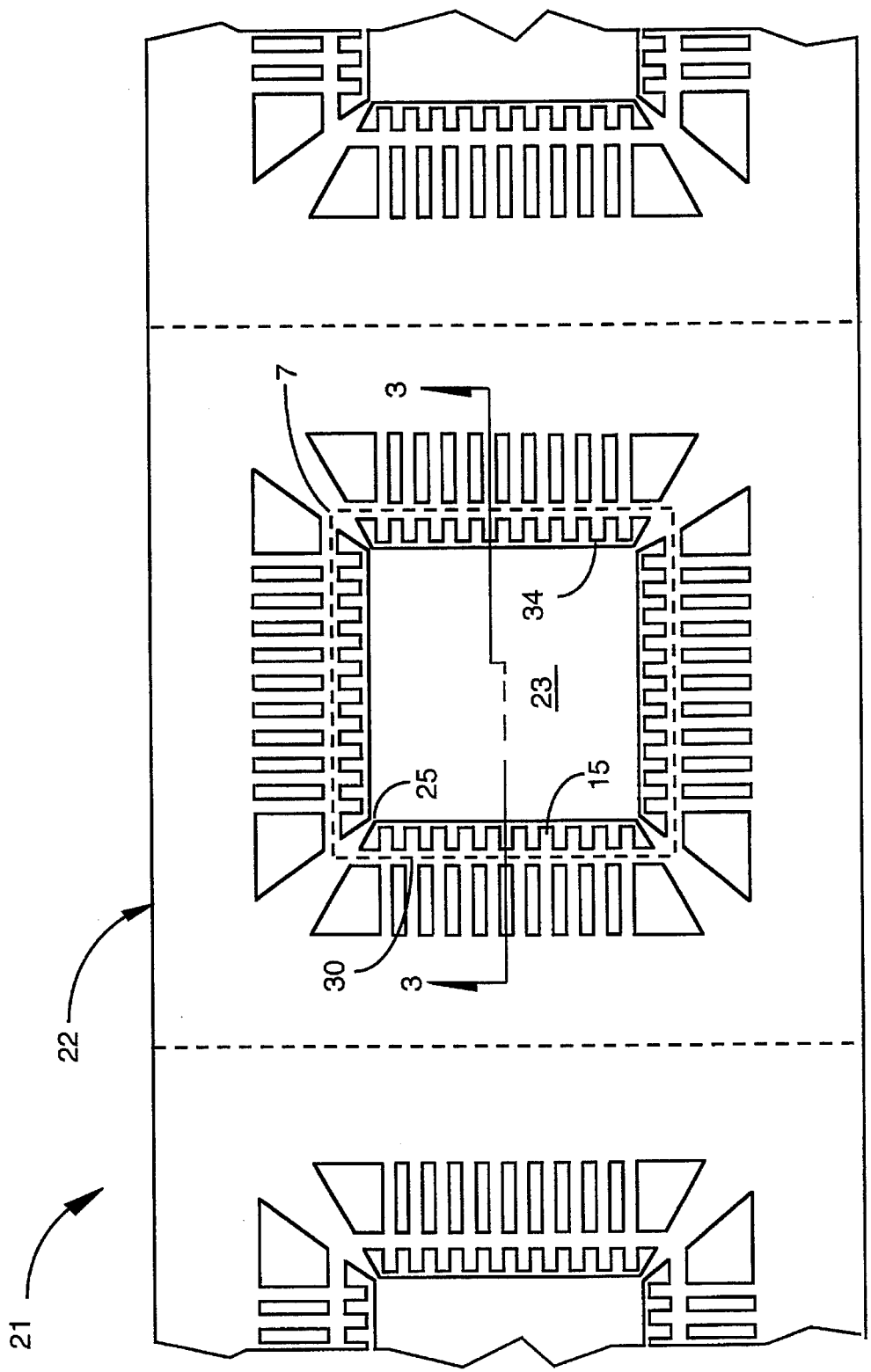
FIG. 2 is a simplified plan view of a conventional lead frame strip.

FIG. 2 is an idealized plan view of one frame 22 of a typical lead frame strip 21 before the process of die placement and encapsulation. Strip 21 comprises several identical lead frames 22 where individual IC packages are constructed. The layout of FIG. 2 is intentionally simplified to illustrate the principles involved. Lead frame strips can vary in size and design according to different IC packages and the automated machinery that produces them. They are made of a conductive material, typically metal, and formed in thin sheets. The sheet thickness of lead frame strip 21 is the thickness of the leads.

In the center of lead frame 22, leads 15 are provided approaching, but not contacting, island 23. Gap 34 serves to electrically island 23 from each lead. Island 23 is supported in this example by legs 25 that are contiguous to lead frame strip 21, typically formed to attach at the corners of the island. Lead frame 22 also defines the outer edges of the plastic encapsulation by means of structures between leads 15 to stop the flow of the liquid-phase polymer in the encapsulation process. These structures comprise dam bars 30, and their placement between leads provides a contiguous strip of material around each island, illustrated by broken line 7. The necessity for dam bar 30 means that at this stage all leads 15 surrounding island 23 are electrically connected. Embodiments of the present invention address the removal of the dam bars in the IC packaging process, providing electrical isolation for each lead.

Figure 3:
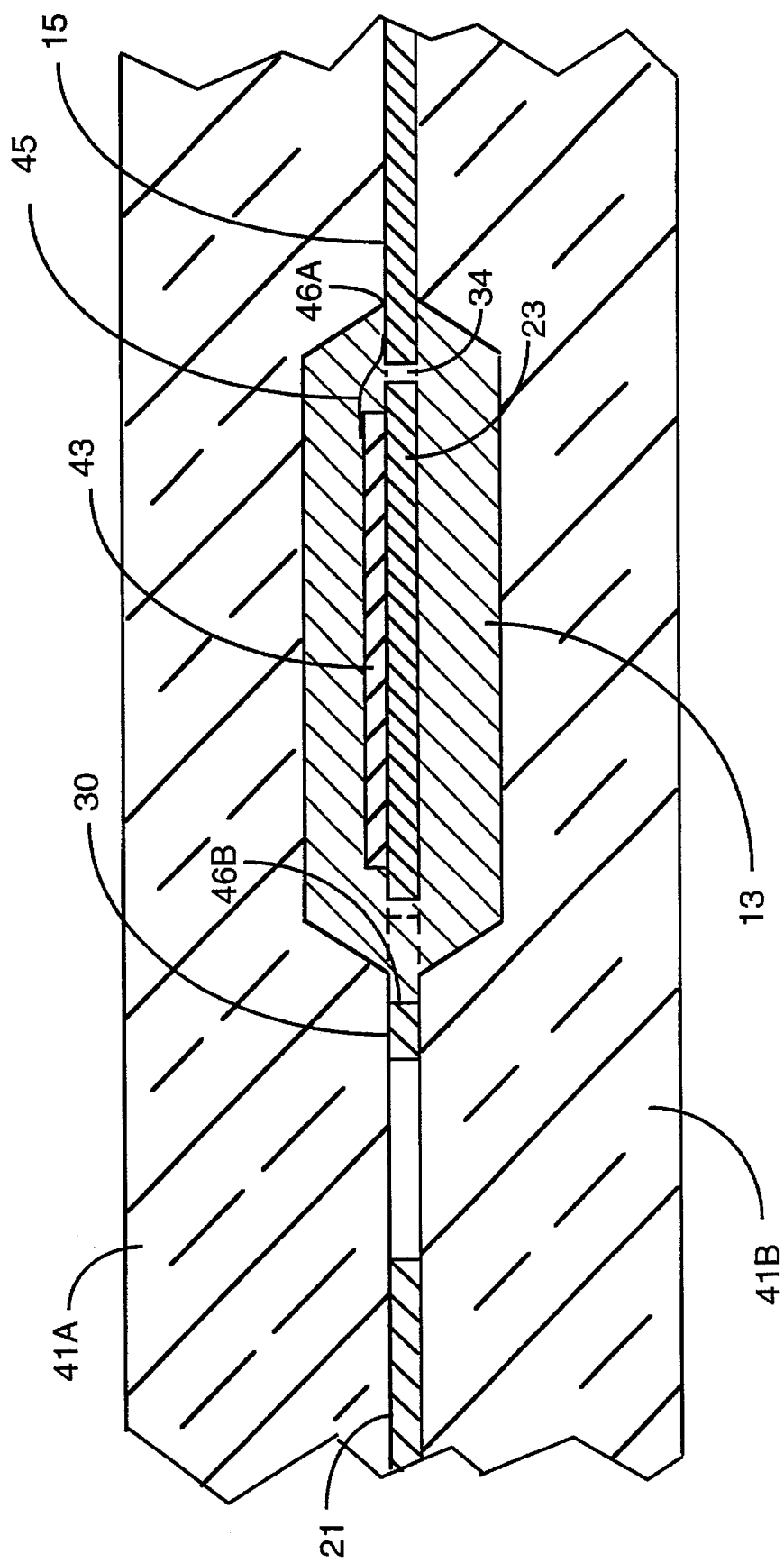
FIG. 3 is cross-sectional view taken along line 3—3 of FIG. 2 showing the encapsulation stage in the packaging of an IC.

FIG. 3 is a cross-sectional view of lead frame 21 taken at section line 3—3 of FIG. 2 after die placement, die bonding, and encapsulation, with the encapsulation mold in place. Before encapsulation, an IC die 43 is placed on island 23 and wires 45 are bonded between each contact pad in the die and its respective lead. Wires 45 span gap 34 between each mounting pad on the IC die and its respective lead. Lead frame strip 21 is then positioned between two opposing, typically symmetric molds 41A and 41B. Within the body of the molds, at each island region, there is typically a passage for entry of injected liquid-phase polymer and one or more passages for bleeding off displaced air. These passages are not shown in FIG. 3, but are typically located at the corners of the molds.

Molds 41A and 41B are positioned and centered on each die 43, and liquid-phase polymer is injected and flows until it fills the cavity. When the polymer has solidified, molds 41A and 41B are removed and lead frame strip 21, with the encapsulated and bonded die 43, is ready for trimming to produce individual IC packages.

Figure 4:
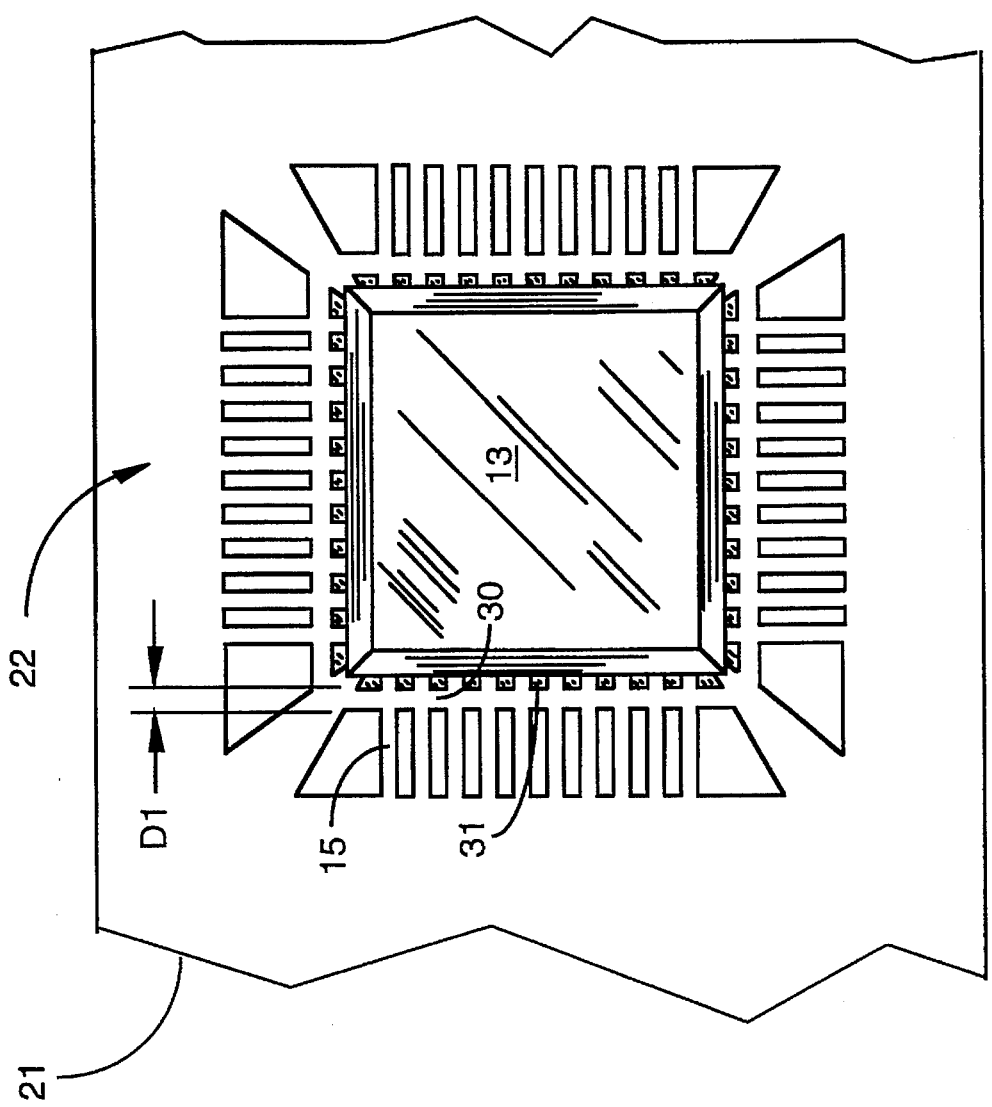
FIG. 4 is a top plan view of the package of FIG. 3 with the encapsulation step completed.

FIG. 4 is a top plan view of lead frame strip 21 at individual frame 22 after encapsulation, ready for subsequent processing to separate all individual leads 15 and remove tabs 31 at the perimeter of the IC package. This process is typically performed in automated machines as described in the Background section above. In machining of this sort, lead frame strips 21 are typically loaded in a magazine and individually fed to tooling positions in the automatic equipment.

Dam bars 30 to be trimmed can vary in width D1 according to the particular design of lead frame 22. Typically, removal of the dam bar is done by a punch that fits into a holder on the automated machine. An automatic machine is designed to use punches of different size and configuration to be able to process lead frames of different size and configuration. Mechanisms on the machine can be adjusted to accommodate different standard lead frame strips and different punches.

Figure 6B:
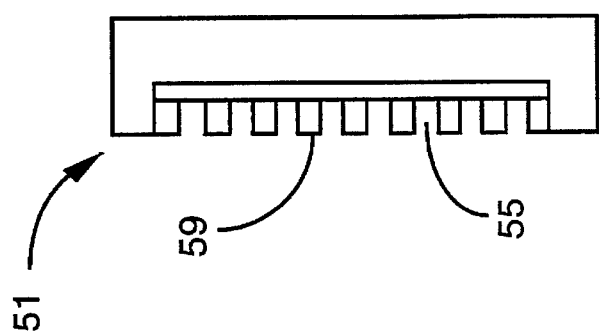
FIG. 6B is an end view of the punch of FIG. 5.
Figure 6A:
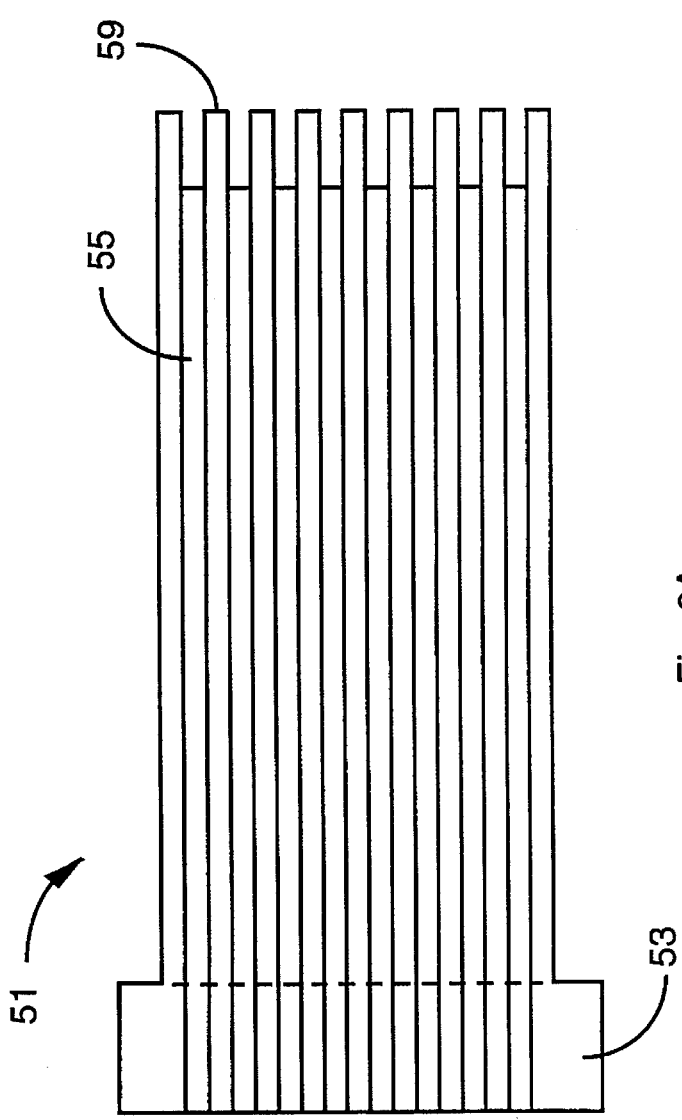
FIG. 6A is a top view of the punch of FIG. 5.
Figure 6C:
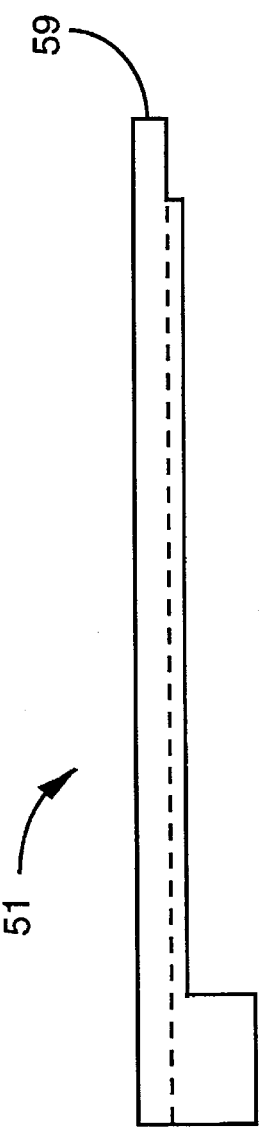
FIG. 6C is a side elevations view of the punch of FIG. 5.

FIG. 5 is an isometric view of a punch 51 according to an embodiment of the invention. FIGS. 6A, 6B and 6C are alternate 2-dimensional views of the punch of FIG. 5. In this embodiment punch 51 is made of a hardened material with grooves 55 formed to a depth D2 and width D3 typically equally spaced along one flat side. The depth of the grooves is somewhat greater than the width of one section of dam bar to be removed by the punch, and the width of the groove is determined by the lead spacing for the particular lead frame to be trimmed. Width D4 of the punch corresponds to the width of a side of the IC package to be processed. The number of grooves corresponds generally to the number of leads along one side of the package although there may be other teeth as well for trimming island supports and the like.

Individual separate teeth 59 are provided on punch 51 by machining away a volume 60 across the end of the punch to a depth D6 and a length D9. This step removes part of the solid material of the body of the punch, and the ridges of material between the grooves 55 for length D9 becomes a set of protruding teeth 59 of length D9. The length D9 of the teeth is sufficient to punch through lead frame 21, (FIG. 4) removing all material cleanly from the surrounding metal strip. Thickness D7 is substantiality equal to groove depth D2 plus the machining depth D6. Punch overall thickness D7 can vary in alternative embodiments of the invention. Region 53 of the punch is configured to fit in a standard attachment mechanisms on automated machines, and may take various forms depending on the requirements of the particular machine. The grooves may extend the full length of the body of the punch, as shown, or they may stop short of the end of region 53.

In a unique aspect of the present invention, when a tooth 59 breaks in use, punch 51, by virtue of the lengthwise grooves, can be inexpensively renewed by a standardized grinding procedure. The process of renewal comprises two operations. In one step the punch is shortened at tooth 59 end past the point of failure. This is typically a surface grinding operation. This effectively leaves a uniform symmetric surface for a new tooth end. As an example, if one or more teeth were to break off entirely, the punch might be shortened to line 62, removing all remaining teeth. In a second step material in volume 58 is ground away to a depth of D6 over a length D10 so new teeth are exposed. This is typically a simple surface grinding operation and the existence of grooves 55 provide for the new teeth. The new length D11 of the punch can then be adjusted for in the standard fixturing of the existing automated machines.

Length D8 for punch 51 is determined by structural parameters and requirements for universal adaptation in exiting automated machines. Typically, length D8 provides for a number of instances of renewing the punch.

Figure 7:
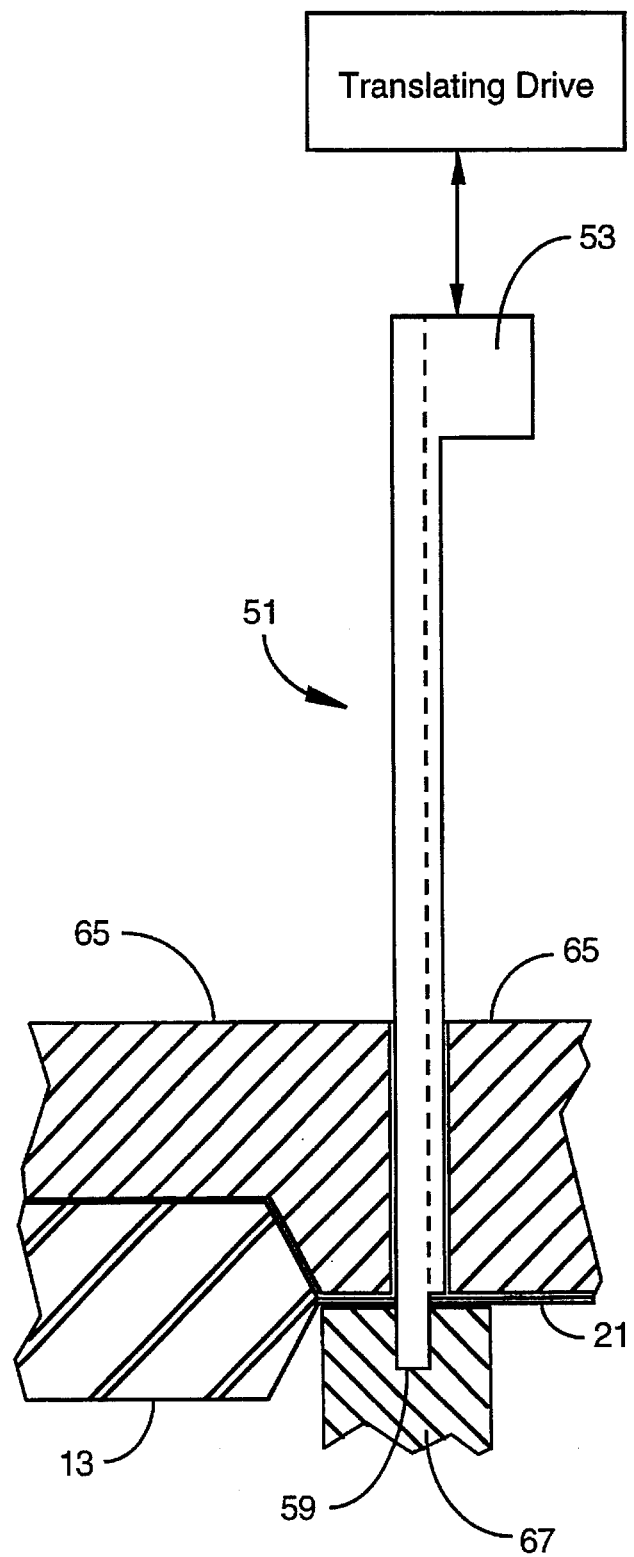
FIG. 7 is a cross-sectional view of the punch of FIG. 5 in a material removal operation, showing also associated elements for positioning the package and guiding the punch.

FIG. 7 is somewhat idealized cross-sectional view of an operation in an automated machine according to an embodiment of the invention. Punch 51 is shown advanced, having passed through and removed sections of the dam bar. Punch 51 is guided by stripper elements 65 and a mating punch die 67 helps to support and the lead frame and provides a shearing interface with the punch. In alternative embodiments, punch 51 can be used as a de-junking tool, lead frame trimming tool, or as a punch in other sheet punching machine operations, both singly and in combination. In most cases, the punch is used to simultaneously to cut the dambar, removing a portion of it, and to remove plastic flash between the leads near the encapsulated package.

It will be apparent to one with the skill in the art that there are many changes that might be made without departing from the spirit and scope of the invention. There are, for example, a broad range of materials suitable for the punch in various embodiments. Tungsten carbide is a preferred material, but punches could also be made from some hard, non-metallic materials, and from hard-coated softer materials. In some embodiments the grooved potions of the punch might be made to attach with fasteners to the mounting end. Also there is very wide variation in dimensions suitable for such punches, and it is not required that the grooves extend the full length of the punch body as shown in the embodiments described above. There are similarly many other alterations in detail that might be made without departing from the spirit and scope of the invention.

What is claimed is:

1. A punch for trimming integrated circuit (IC) lead frames, comprising:

a mounting portion at a first end for attaching the punch to a translating drive in a processing machine; and a substantially rectangular shank portion having a first length extending from said mounting portion to a second end opposite the first end, a width, and a thickness;

wherein the shank portion has an array of substantially rectangular lengthwise grooves extending from the second end for a second length equal or less than the first length, the grooves spaced apart across the width of the shank portion on a first side, having a common depth less than the thickness of the shank portion, and forming an array of substantially rectangular lengthwise ribs extending to the second end, the shank portion also having a widthwise step at the second end across a second side opposite the first side and with a third length substantially less than the second length, such that the array of ribs extends from the end of said shank portion as an array of separate punch teeth.

2. A punch as in claim 1 wherein the material of the punch is through-hardened steel.

3. A punch as in claim 1 wherein the material of the punch is tungsten carbide.

4. An apparatus for trimming a lead frame in the formation of IC packages, comprising;

a support for holding said lead frame during the trimming;

a stripper for guiding the punch and for holding the lead frame from above;

a translating drive for holding and driving the punch; and a punch having a mounting portion at a first end for attaching the punch to a translating drive in a processing machine, and a substantially rectangular shank portion having a first length extending from said mounting portion to a second end opposite the first end, a width, and a thickness;

wherein the shank portion has an array of substantially rectangular lengthwise grooves extending from the second end for a second length equal or less than the first length, the grooves spaced apart across the width of the shank portion on a first side, having a common depth less than the thickness of the shank portion, and forming an array of substantially rectangular lengthwise ribs extending to the second end, the shank portion also having a widthwise step at the second end across a second side opposite the first side and with a third length substantially less than the second length, such that the array of ribs extends from the end of said shank portion as an array of separate punch teeth.

\* \* \* \* \*